(12) United States Patent
Harrigan et al.

(10) Patent No.: US 11,943,905 B2
(45) Date of Patent: Mar. 26, 2024

(54) SYSTEMS AND METHODS FOR ELECTROMAGNETIC SHIELDING OF ROTATING COMPONENTS

(71) Applicant: Microsoft Technology Licensing, LLC, Redmond, WA (US)

(72) Inventors: Jason A. Harrigan, Sultan, WA (US); David Bennett Johnson, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/576,366

(22) Filed: Jan. 14, 2022

(65) Prior Publication Data

US 2023/0232601 A1 Jul. 20, 2023

(51) Int. Cl.
*H02K 11/01* (2016.01)
*F04D 29/00* (2006.01)
*H02K 11/02* (2016.01)
*H05K 9/00* (2006.01)
*H05K 7/20* (2006.01)

(52) U.S. Cl.
CPC ......... *H05K 9/0018* (2013.01); *F04D 29/002* (2013.01); *H02K 11/01* (2016.01); *H02K 11/02* (2013.01); *H05K 7/20154* (2013.01)

(58) Field of Classification Search
CPC .. H02K 5/00; H02K 5/04; H02K 5/14; H02K 5/148; H02K 7/00; H02K 7/003; H02K 7/08; H02K 11/00; H02K 11/01; H02K 11/014; H02K 11/0141; H02K 11/02; H02K 13/00; H02K 13/006; H05K 9/00; H05K 9/0018; H05K 7/00; H05K 7/20154; F04D 29/00; F04D 29/002
See application file for complete search history.

(56) References Cited

U.S. PATENT DOCUMENTS

| | | | |
|---|---|---|---|
| 7,183,500 B2 | 2/2007 | Campini et al. | |
| 9,622,338 B2 | 4/2017 | Song et al. | |
| 9,743,564 B2 | 8/2017 | Malek et al. | |
| 10,779,449 B1 | 9/2020 | Cananzi | |

(Continued)

FOREIGN PATENT DOCUMENTS

| | | |
|---|---|---|
| DE | 102015205028 A1 | 6/2016 |
| JP | 62115068 A * | 7/1987 |

OTHER PUBLICATIONS

"International Search Report and Written Opinion Issued in PCT Application No. PCT/US2022/052911", date Apr. 21, 2023, 14 Pages.

*Primary Examiner* — Tran N Nguyen
(74) *Attorney, Agent, or Firm* — RAY QUINNEY & NEBEKER P.C.; John O. Carpenter (57) ABSTRACT

An EMI attenuation device includes a housing stator, a fan rotor, and an electrical bridge therebetween. The housing stator has an aperture therethrough, and at least a portion of the housing stator is electrically conductive. The fan rotor is adjacent to the aperture and has a rotational axis relative to the housing stator and a proximate surface proximate the housing stator. The fan rotor is electrically conductive, and the proximate surface is continuous around a rotational direction of the fan rotor. The electrical bridge is between the proximate surface of the fan rotor and a contact surface of the housing stator.

20 Claims, 5 Drawing Sheets

(56) References Cited

U.S. PATENT DOCUMENTS

| | | |
|---|---|---|
| 10,873,149 B2 | 12/2020 | Chen |
| 2003/0123227 A1* | 7/2003 | Chin-Wen ............ H01L 23/467 |
| | | 174/16.3 |
| 2005/0132885 A1 | 6/2005 | Zarganis et al. |
| 2008/0055853 A1* | 3/2008 | Lin ........................ G06F 1/20 |
| | | 257/E23.099 |
| 2013/0038182 A1 | 2/2013 | Obata et al. |
| 2016/0233636 A1 | 8/2016 | Fukumoto |
| 2019/0081538 A1 | 3/2019 | Nye et al. |
| 2020/0119616 A1* | 4/2020 | Ludwig ................ H02K 11/014 |
| 2020/0292079 A1* | 9/2020 | Ito ........................ F16J 15/3208 |
| 2022/0060089 A1* | 2/2022 | Benecke ................ H02K 5/148 |

\* cited by examiner

SYSTEMS AND METHODS FOR ELECTROMAGNETIC SHIELDING OF ROTATING COMPONENTS

BACKGROUND

Background and Relevant Art

Electronic devices (such as computing devices and gaming consoles) are provided with fans or blowers for thermal efficiency, but due to their current construction they are not adapted to provide electromagnetic interference (EMI) shielding. Conventional systems use an EMI shielding mesh with perforated metal holes near the fan or blower, which impedes air flow and hinders thermal efficiency.

BRIEF SUMMARY

In some embodiments, an EMI attenuation device includes a housing stator, a fan rotor, and an electrical bridge therebetween. The housing stator has an aperture therethrough, and at least a portion of the housing stator is electrically conductive. The fan rotor is adjacent to the aperture and has a rotational axis relative to the housing stator and a proximate surface proximate the housing stator. The fan rotor is electrically conductive, and the proximate surface is continuous around a rotational direction of the fan rotor. The electrical bridge is between the proximate surface of the fan rotor and a contact surface of the housing stator.

In some embodiments, an EMI attenuation device includes a stator having an aperture therethrough, a shaft rotor in the aperture, and an electrical bridge between the shaft rotor and a surface of the aperture. At least a portion of the stator proximate the aperture is electrically conductive. The shaft rotor has a rotational axis relative to the stator and a circular OD surface. The OD surface of the shaft rotor is electrically conductive, and the circular OD surface is continuous around a circumference of the shaft rotor. The electrical bridge is located between the circular OD surface of the shaft rotor and an ID surface of the aperture.

In some embodiments, an electronic device includes a housing with an aperture therein, a heat source, a heat transfer element, and an EMI shielding device located proximate the aperture. The heat transfer element is thermally connected to the heat source to transfer heat from the heat source toward an aperture in the housing. The EMI shielding device includes a stator having the aperture therethrough, and at least a portion of the stator is electrically conductive. The EMI shielding device also includes a fan rotor that is adjacent to the aperture, has a rotational axis relative to the stator, and has a proximate surface proximate the stator. The fan rotor is electrically conductive, and the proximate surface is continuous around a rotational direction of the fan rotor. The fan rotor is configured to exhaust heat from the heat transfer element through aperture. The electrical bridge is between the proximate surface of the fan rotor and a contact surface of the housing stator.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a top view of an axial fan with an electromagnetic interference (EMI) shielding device, according to at least one embodiment of the present disclosure;

FIG. 3-2 is a partial side cross-sectional view of the EMI shielding device of FIG. 3-1;

FIG. 7-1 is a transverse cross-sectional view of a shaft rotor with an EMI shielding device, according to at least one embodiment of the present disclosure; and FIG. 7-2 is a longitudinal cross-sectional view of the EMI shielding device of FIG. 7-1.

DETAILED DESCRIPTION

The present disclosure relates generally to systems and methods for electromagnetic interference (EMI) or radio frequency (RF) shielding. More particularly, the EMI shielding devices described herein are configured to provide EMI or RF shielding for a general-purpose computing device, a specialized video game console or other specialized computing device, and other electronic devices such as electric motors. In some embodiments, EMI shielding devices according to the present disclosure are configured to allow rotation of a rotor relative to and/or through an aperture in a device housing. The rotor may be a fan rotor, such as an axial fan or transverse blower in a personal computer or video game console, or a shaft rotor, such as a drive shaft of an electric motor that transfers torque through a housing or chassis. In some embodiments, EMI shielding devices according to the present disclosure allow rotation of the rotor relative to the stator while limiting and/or preventing transmission of EMI into or out of the aperture in the device housing.

In some embodiments, an EMI shielding device according to the present disclosure is positioned proximate a fan to receive heat from a computing component of the electronic device. In some examples, the computing component, such as a processor, system memory, hardware storage device, networking device, etc. may be susceptible to EMI that compromises the performance of the computing component. In other examples, the computing component may generate EMI that adversely affects the performance of other computing components of the electronic device.

In some embodiments, an EMI shielding device according to the present disclosure is part of a fan. The fan may move air over, through, or past a thermal management device (such as a fin pack), which receives heat from at least one heat source in the electronic device and transfers the heat to the air. In some embodiments, the heat source is a processor, such as a central processing unit (CPU), a graphical processing unit (GPU); a storage device, such as random-access memory (RAM), other volatile memory, non-volatile memory, or combinations thereof. In some embodiments, the heat source is coupled directly to the thermal management device. In some embodiments, the heat source is thermally connected to the thermal management device with at least one thermally conductive or convective element therebetween.

In some examples, the heat source is thermally connected to the thermal management device by a thermal interface material (TIM), such as a thermal paste, sandwiched between a surface of the heat source and a surface of the thermal management device. In some examples, the heat source is thermally connected to the thermal management device by a heat pipe, vapor chamber, heat spreader, or other thermally conductive or convective element that transports heat from a surface of the heat source to a surface of the thermal management device. The thermal management device is thermally connected to the heat source when at least element of the thermal management system is intended to physically connect the thermal management device to the heat source. In other words, a thermal management device that receives heat from the heat source only by ambient air flowing therebetween is not thermally connected, while a thermal management device connected to a heat source by a vapor chamber with a two-phase working fluid moving therein is thermally connected when a surface of the vapor chamber contacts a surface of the heat source and a surface of the thermal management device. In another example, a thermal management device is thermally connected to the heat source when the heat source is in contact with a first TIM, which contacts a surface of a heat pipe, which contacts a second TIM, which contacts a surface of the thermal management device.

In some embodiments, an EMI shielding device according to the present disclosure allows airflow through an aperture to reject excess heat to the ambient atmosphere while also limiting and/or preventing EMI from passing through the aperture in the housing proximate the fan. In some embodiments, the EMI shielding device includes a plurality of channels between the rotor and stator. In some embodiments, the channels have a maximum transverse dimension (e.g., width) that is less than a longitudinal dimension (e.g., length) to limit the passage of EMI through the channel.

Figure 1:
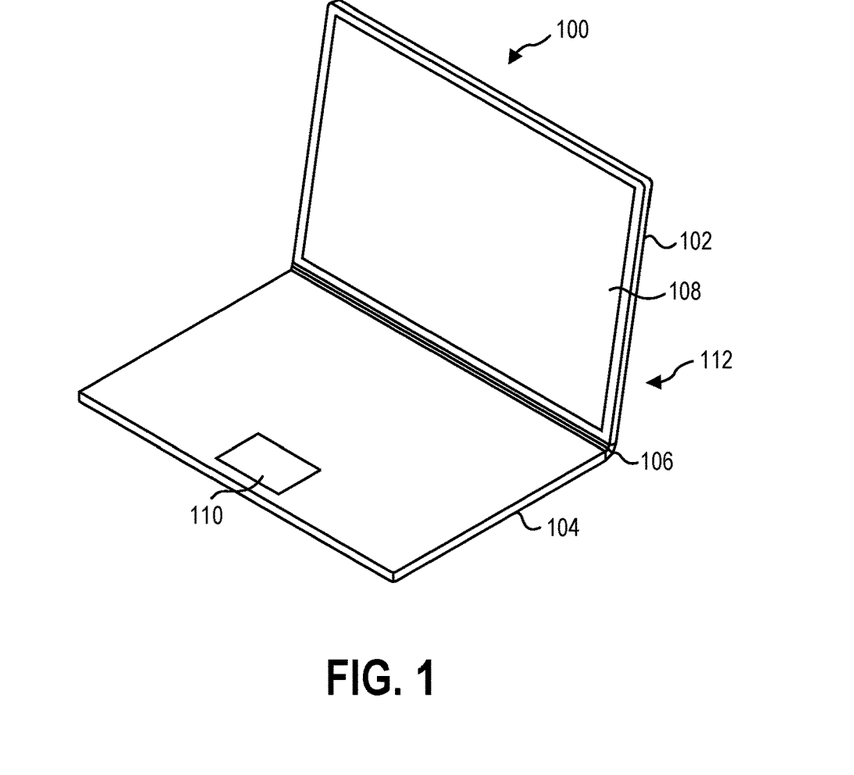
FIG. 1 is a perspective view of a computing device, according to at least one embodiment of the present disclosure.

FIG. 1 is a perspective view of an embodiment of a computing device 100. The computing device 100 may include a first portion 102 and a second portion 104 movably connected to one another by a hinge 106. In some embodiments, the first portion 102 of the computing device 100 may include a display 108 to present visual information to a user and the second portion 104 of the computing device 100 may include one or more input devices 110, such as a trackpad, a keyboard, etc., to allow a user to interact with the computing device 100. In embodiments in which the computing device is a hybrid computer, the first portion 102 may include the display 108 and at least a processor 112. The first portion 102 may further include additional computer components, such as a storage device, system memory, a graphical processing unit, graphics memory, one or more communication devices (such as WIFI, BLUETOOTH, near-field communications), peripheral connection points, etc. In some embodiments, the first portion 102 may be removable from the hinge 106 and/or the second portion 104.

In some embodiments, the computing device 100 is a specialized computing device, such as a video game console, or a general-purpose desktop tower computer that is connected to an external display and/or audio devices. In such embodiments, the computing device 100 includes one or more of the computer components, such as a storage device, system memory, a graphical processing unit, graphics memory, one or more communication devices (such as WIFI, BLUETOOTH, near-field communications), peripheral connection points, etc. in a single housing of the computing device 100.

Figure 2:
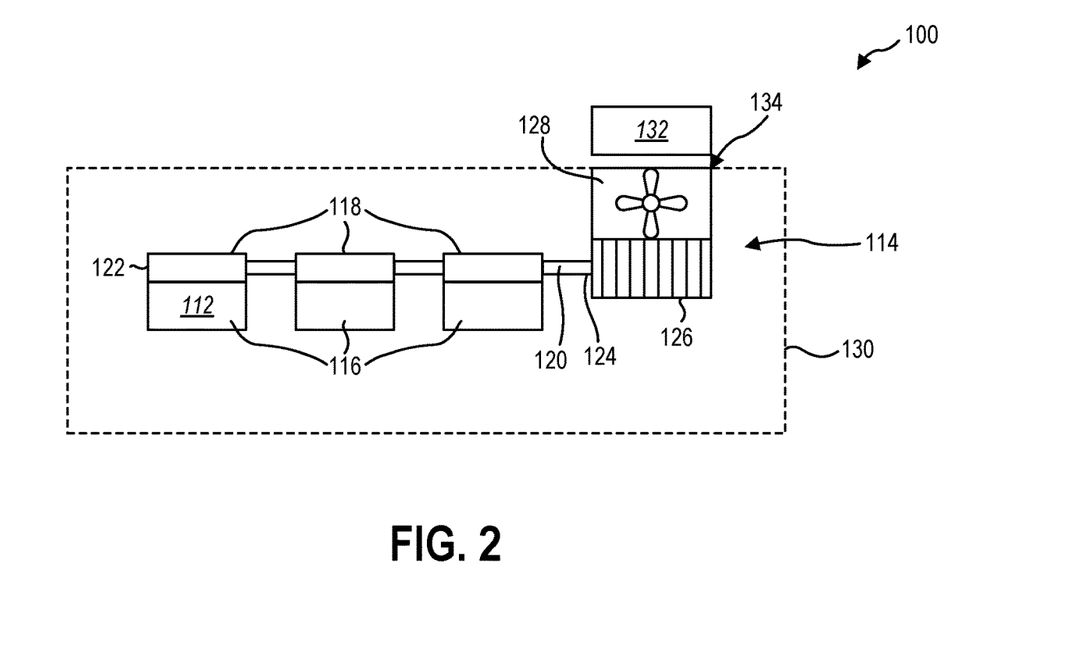
FIG. 2 is a schematic representation of thermal and electromagnetic management in a computing device, according to at least one embodiment of the present disclosure.

FIG. 2 is a detail view of cooling system 114 of a computing device 100 described in relation to FIG. 1. The computing device 100 includes a variety of components that generate heat. The heat sources 116 can be any component of the computing device that generates heat but, particularly, may include a processor 112 (such as a central processing unit (CPU), a graphical processing unit (GPU), a physics processing unit, or other processors), system memory, video memory, storage devices, networking devices, display devices, input devices, optical drives, peripheral connection ports, or any other components of the computing device 100.

In some embodiments, the heat from the heat sources 116 is distributed from a heat source 116 across a surface by a heat spreader 118. In other embodiments, the heat is conducted from the heat sources 116 toward a cooler region of the computing device 100 and/or toward an exhaust by a heat transfer element 120. In yet other embodiments, the heat is conducted from a heat source 116 through a coldplate to a heat transfer element 120.

The heat transfer element 120 may be a thermally conductive material, such as copper, silver, or aluminum that conducts heat from a region of higher thermal energy to a region of lower thermal energy. For example, the heat transfer element 120 will conduct thermal energy from the first end 122 of the heat transfer element 120 adjacent the heat sources 116 toward a cooler second end 124 of the heat transfer element 120 near a heat sink to lessen a temperature gradient along the heat transfer element 120. In other examples, the heat transfer element 120 may be a heat pipe that may further aid in transferring thermal energy away from the heat sources 116.

At the higher temperature ("hot") interface of a heat pipe a liquid in contact with a thermally conductive solid surface turns into a vapor by absorbing heat from that surface. The vapor then travels along the heat pipe to a lower temperature ("cold") interface and condenses back into a liquid releasing the latent heat. The liquid then returns to the hot interface through, for example, capillary action, centrifugal force, or gravity, and the cycle repeats. Due to the high heat transfer coefficients for boiling and condensation, vapor cooling system heat pipes are effective thermal conductors. The effective thermal conductivity varies with heat pipe length and can approach 100 kW/(m·K) for long heat pipes, in comparison with approximately 400 W/(m·K) for copper.

In some embodiments, the second end 124 of heat transfer element 120 is in contact with, in proximity to, or attached to a heat sink, such as a fin pack 126. The fin pack 126 includes or is made of a thermally conductive material to conduct thermal energy from the second end 124 of the heat transfer element 120 into the fin pack 126. The fin pack 126 has a plurality of fins, channels, rails, or other structures that increase the surface area of the fin pack 126 to dissipate the thermal energy.

In some embodiments, the thermally conductive material has a thermal conductivity in a range having an upper value, a lower value, or upper and lower values including any of 100 Watts per meter-Kelvin (W/m·K), 125 W/m·K, 150 W/m·K, 175 W/m·K, 200 W/m·K, 250 W/m·K, 300 W/m·K, 400 W/m·K, 450 W/m·K, or any values therebetween. For example, the thermal conductivity may be greater than 100 W/m·K. In other examples, the thermal conductivity may be less than 450 W/m·K. In yet other examples, the thermal conductivity may be between 100 W/m·K and 450 W/m·K. In further examples, the thermal conductivity may be greater than 150 W/m·K. In at least one example, the thermal conductivity may be greater than 250 W/m·K.

The cooling system 114 dissipates the thermal energy through air flowed through or over the fin pack 126 by a fan 128. The fan 128 may move air flow through one or more channels of the fin pack 126 such that air absorbs thermal energy from the surfaces of the fin pack 126. The dissipation of heat from the fin pack 126 reduces the temperature of the fin pack 126 to allow the heat transfer element 120 to transfer more heat from the heat sources 116 to the fin pack 126.

In a conventional computing device 100, a Faraday cage 130 may be positioned around or over at least a portion of the electronic components. For example, the processor 112 or other electronic components of the computing device 100 generate EM radiation during operation. The EM radiation emitted by the processor 112 or other electronic components can interfere with the operation of an external electronic component 132. In other examples, an external electronic component 132 produces EMI that may adversely impact the electronic components inside the Faraday cage 130.

The Faraday cage 130 defines an external side (external to the Faraday cage 130) and an internal side (internal to the Faraday cage 130). The Faraday cage 130 may include a conductive material to suppress the EM radiation from the processor 112 or other electronic components internally. The internal conduction of the EM radiation along the Faraday cage shields the EM radiation that may interfere with the operation of the external electronic component(s) 132 and vice versa.

However, a conventional Faraday cage 130 is inefficient at transferring energy through the Faraday cage 130 and may cause the heat sources 116 to increase in temperature by limiting ventilation through the Faraday cage 130. In some embodiments, an aperture 134 is provided in the Faraday cage 130 to allow air flow through the aperture to exhaust the thermal energy (via warm air) from the heat sources 116 and the computing device 100. In some embodiments, the aperture 134 has a shaft positioned therethrough to transfer torque, such as produced by an electric motor or received by a generator. In either instance, the aperture 134 is a potential source of EMI leakage through the Faraday cage 130.

In some embodiments, an EMI shielding device according to the present disclosure limits and/or prevent EMI leakage through the aperture 134 by electrically connecting the rotor of the fan 128 or shaft in the aperture to the stator of the aperture and/or Faraday cage 130 housing of the computing device 100.

Figure 31:
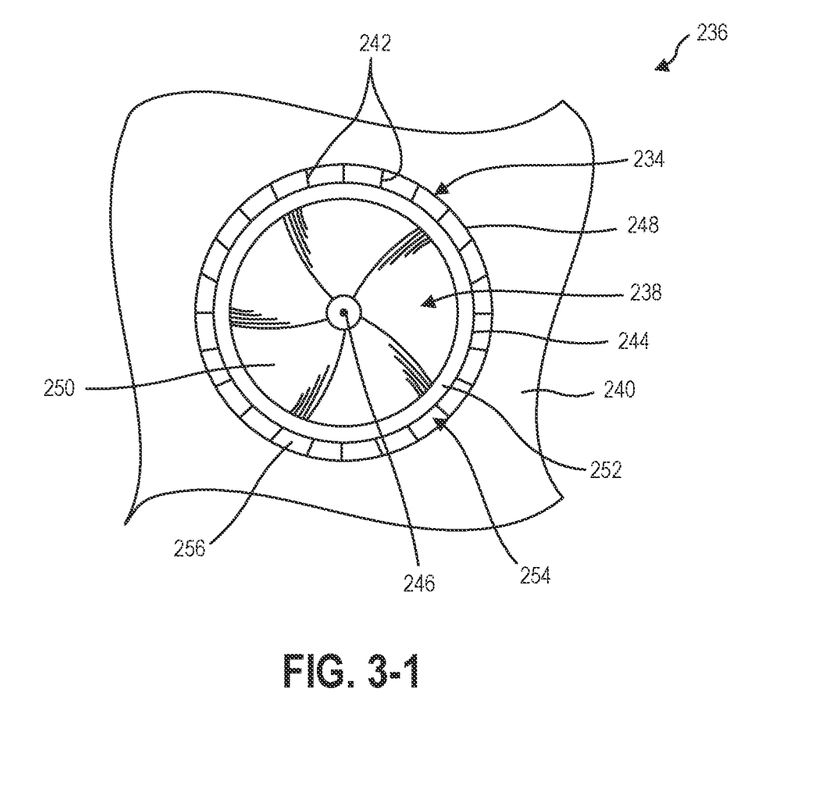

FIG. 3-1 is a top view of an EMI shielding device 236 according to the present disclosure. In some embodiments, the EMI shielding device 236 includes a rotor 238 that rotates relative to a stator 240. While the embodiment of a rotor 238 illustrated in FIG. 3-1 is an axial fan, it should be understood that the rotor 238 may be other devices or components, as will be described herein. The rotor 238 is positioned in or proximate to an aperture 234 in the stator 240, and the rotor 238 rotates relative to the stator 240. In some embodiments, such as an axial fan and/or a blower, the aperture 234 allows airflow through a portion of the fan rotor 238.

The EMI shielding device 236 includes an electrical bridge between the rotor 238 and the stator 240. In some embodiments, the electrical bridge includes conductive fibers 242 that provide an electrically conductive path between the rotor 238 and the stator 240 while the rotor 238 rotates relative to the stator 240. The conductive fibers 242 may be a conductive metal fiber, such as copper, or an electrically conductive non-metal conductive fiber, such as graphite or an electrically conductive polymer.

The conductive fibers 242, in FIG. 3-1 are positioned on a proximate surface 244 of the fan rotor 238 proximate to a contact surface 248 of the aperture 234 in the housing stator 240. In some embodiments, the proximate surface 244 is a radially outermost edge of the fan rotor 238 relative to the rotational axis 246 of the fan rotor 238. The fan rotor 238 rotates around the rotational axis 246 to rotate relative to the housing stator 240 in which the aperture 234 is located.

In some embodiments, the conductive fibers 242 are fixed to the fan rotor 238. For example, the conductive fibers 242 are fixed in the embodiment illustrated in FIG. 3-1 to the proximate surface 244 (e.g., the radially outermost edge) of the fan rotor 238 that is proximate the contact surface 248 of the aperture 234. In other embodiments, the conductive fibers 242 are fixed to the housing stator 240. For example, the conductive fibers 242 may be fixed to the contact surface 248 of the aperture 234 that is opposite the proximate surface 244 of the fan rotor 238. In yet other embodiments, the conductive fibers 242 are fixed to the fan rotor 238 and the housing stator 240. For example, a first plurality of conductive fibers 242 are fixed to the proximate surface 244 (e.g., the radially outermost edge) of the fan rotor 238 that is proximate the contact surface 248 of the aperture 234 and a second plurality of conductive fibers 242 are fixed to the to contact surface 248 of the aperture, where the first plurality of conductive fibers 242 are positioned to contact and provide an electrical connection with the second plurality of conductive fibers 242 as the fan rotor 238 rotates relative to the housing stator 240.

The electrical bridge has a conductivity sufficient to allow transmission of electrical current across the electrical bridge to maintain the Faraday-cage effect. In some embodiments, the electrical bridge has a resistivity less than 500 milliohm per linear centimeter around an arc segment of 1 centimeter of the electrical bridge to provide sufficient conductivity. For example, the electrical bridge may have a resistivity less than 400 milliohm per linear centimeter. In other examples, the electrical bridge has a resistivity less than 250 milliohm per linear centimeter around an arc segment of 1 centimeter of the electrical bridge to provide sufficient conductivity.

In some embodiments, the proximate surface 244 of the fan rotor 238 is continuous around the fan rotor 238 in the rotational direction around the rotational axis 246. In some embodiments, the proximate surface 244 is an outermost surface of an annular body 252 around the fan rotor 238. For example, the annular body 252 may be a continuous annulus around the fan blade(s) 250 of fan rotor 238 that provides a continuous and electrically conductive surface around the circumference of the fan rotor 238.

In some embodiments, at least a portion of the EMI leakage occurs in a gap 254 between the proximate surface 244 of the rotor 238 and the contact surface 248 of the stator 240. In the embodiment illustrated in FIG. 3-1, the gap 254 is an annular space between the radially outermost edge of the annular body 252 and the edge of the aperture 234. An EMI shielding device 236 according to the present disclosure bridges that gap 254 with an electrical bridge to provide electrical conductivity between the rotor 238 and stator 240, such as the conductive fibers 242 in FIG. 3-1.

In some embodiments, electrical bridge (e.g., the conductive fibers 242) partitions the gap 254 into channels 256. In some embodiments, the channels 256 allow airflow therethrough while attenuating EMI that would otherwise interfere with electronic components.

Figure 32:
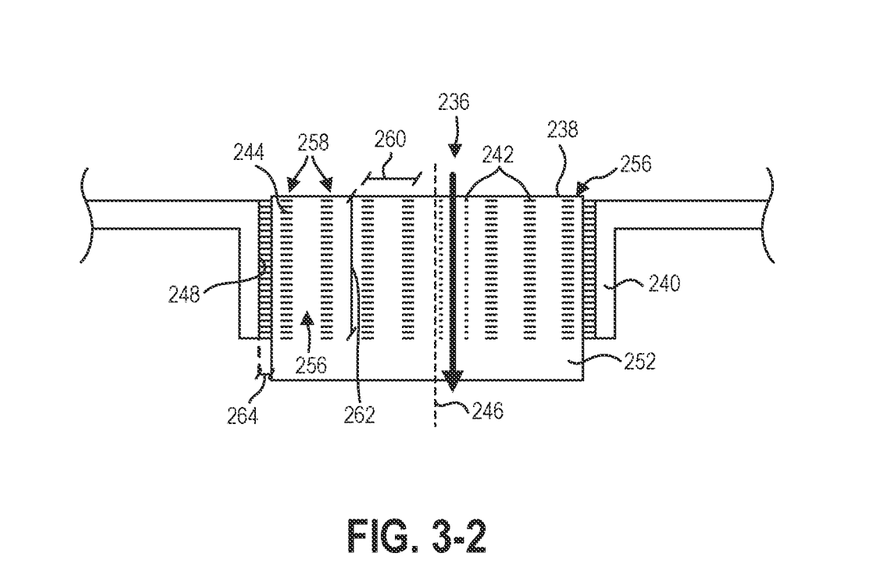

FIG. 3-2 is a side partial cross-sectional view of the EMI shielding device 236 of FIG. 3-1. The EMI shielding device 236 includes a plurality of conductive fibers 242 arranged in rows 258 that define a plurality of channels 256 when contacting and providing electrical conductivity between the proximate surface 244 of the rotor 238 and the contact surface 248 of the stator 240. The channels 256 may allow airflow and EMI therethrough. The channels 256 have a maximum transverse dimension 260 that is transverse to longitudinal direction of the channels 256. For example, in the illustrated embodiment, the rows 258 and, therefore, the channel(s) 256 are oriented axially (e.g., substantially parallel to the rotational axis 246). In other examples, the channel(s) 256 may have a longitudinal direction that is oriented at an angle to the rotational axis 246 of the rotor 238.

The maximum transverse dimension 260 in the illustrated embodiment is in the rotational direction between the rows 258 of conductive fibers 242. In other examples, the maximum transverse dimension may be a gap height 264 between the proximate surface 244 of the rotor 238 and the contact surface 248 of the stator 240.

The attenuation of EMI by the EMI shielding device 236 is at least partially related to a ratio of the maximum transverse dimension 260 to a longitudinal dimension 262 of the channels 256. The longitudinal dimension 262 of the channels 256 and the maximum transverse dimension 260 form a channel ratio. In some embodiments, the channel ratio is at least 2:1. For example, the longitudinal dimension 262 is at least double the maximum transverse dimension 260. In some embodiments, the channel ratio is at least 2.5:1. For example, the longitudinal dimension 262 is at least two and a half times the maximum transverse dimension 260. In some embodiments, the channel ratio is at least 3:1. For example, the longitudinal dimension 262 is at least three times the maximum transverse dimension 260. In some embodiments, the channel ratio is at least 5:1. For example, the longitudinal dimension 262 is at least five times the maximum transverse dimension 260. In a particular example, the longitudinal dimension 262 is 10.0 mm and the maximum transverse dimension 260 is no more than 2.0 mm.

As used herein, a channel 256 is a substantially closed conduit that allows fluid flow in substantially one direction, such as a tube, pipe, or other structure with a transverse aspect ratio of less than 5:1. The transverse dimension 260 is measured through the transverse area of the channel 256, and the aspect ratio is the ratio of the minimum value of the transverse dimension 260 to the maximum dimension. For example, a circular channel has a transverse aspect ratio of 1:1. In another example, a square channel has a transverse aspect ratio of 1.41:1. In another example, a rectangular channel that is 4 mm by 2 mm has a transverse aspect ratio of 1.73:1.

In some embodiments, depending on the shape of the conductive fibers 242 or other electrical bridge and the positioning of the conductive fibers 242 or other electrical bridge between the rotor 238 and stator 240, a channel 256 according to the present disclosure may have a transverse cross-section that is square, rectangular, triangular, other regular polygonal, non-regular polygonal, circular, elliptical, other regular curved shapes, irregular curved shapes, or combinations thereof. The maximum transverse dimension 260 of the channel 256 is the transverse dimension that is greatest.

For example, the EM shielding of a Faraday-cage style shield is based upon the wavelength and the required attenuation at that wavelength. For example, the higher the frequency, the shorter the wavelength of the EM radiation. The shorter the wavelength, the smaller the pores or channel openings need to be to attenuate the EM radiation.

A Faraday-style shield operates by balancing the electrical fields on either side of the shield. A substantially continuous Faraday shield allows the free conduction of electrical charge through the walls of the Faraday shield and becomes a hollow conductor. Introducing an aperture into the Faraday shield allows the leakage of EM radiation through the aperture. For the Faraday cage to function as such, the aperture size must be many times smaller than the wavelength of the interest. In some embodiments, by positioning the EMI shielding device in an aperture of an electronic device housing, the EMI shielding device divides the aperture into a collection of smaller openings based on the channel size. However, as the channels are elongated, the EMI shielding device offers additional attenuation for EM radiation wavelengths smaller than the channel size, as the EM radiation must pass through the length of the channels to leak from the EMI shielding device. For example, attenuation may be controlled by the grounding of the components of the EMI shielding device, the maximum transverse dimension and longitudinal dimension of the channels, quantity of the channels, frequency, other factors, or combinations thereof.

In some embodiments, an EMI shielding device according to the present disclosure attenuates EMI in a frequency range of 2.2 GHz to 2.6 GHz. In other embodiments, an EMI shielding device attenuates EMI in a frequency range of 800 MHz to 900 MHz. In further embodiments, an EMI shielding device attenuates EMI in a frequency range of 1.8 GHz to 2.0 GHz. In yet further embodiments, a thermal management device attenuates EMI in a frequency range of 5.0 GHz to 6.0 GHz.

In some embodiments, an EMI shielding device according to the present disclosure attenuates EMI in the frequency range by at least 20 dB throughout the frequency range. In other embodiments, an EMI shielding device attenuates EMI in the frequency range by at least 30 dB throughout the frequency range. In yet other embodiments, an EMI shielding device attenuates EMI in the frequency range by at least 40 dB throughout the frequency range.

In some embodiments, an EMI shielding device according to the present disclosure attenuates EMI in the frequency range by an average of at least 20 dB across the frequency range. In other embodiments, an EMI shielding device attenuates EMI in the frequency range by an average of at least 30 dB across the frequency range. In yet other embodiments, an EMI shielding device attenuates EMI in the frequency range by an average of at least 40 dB across the frequency range.

In some embodiments, the proximate surface 244, contact surface 248, and/or electrical bridge (e.g., conductive fibers 242 of FIGS. 3-1 and 3-2) of the channels 256 include an electrically conductive material. Examples of suitable materials include, but are not limited to copper, aluminum, iron, tin, magnesium, or alloys thereof; graphite; and electrically conductive polymers.

In other embodiments, the conductive fibers 242 of the electrical bridge are arranged substantially continuously around the proximate surface 244 between the proximate surface 244 and the contact surface 248 such that there are no channels 256 formed. For example, the conductive fibers 242 may form a continuous ring around at least a portion of the longitudinal length of the rotor 238 in the longitudinal direction of the rotational axis 246. The continuous ring of conductive fibers 242 may substantially cover the space in the aperture 234 between the proximate surface 244 and the contact surface 248. In other examples, the conductive fibers 242 may be staggered (such as the rows 258 positioned at an angle to the rotational axis 246) or randomly, such that, in the longitudinal direction through the aperture 234 (e.g., from the perspective illustrated in FIG. 2), the electrical bridge appears continuous.

Figure 4:
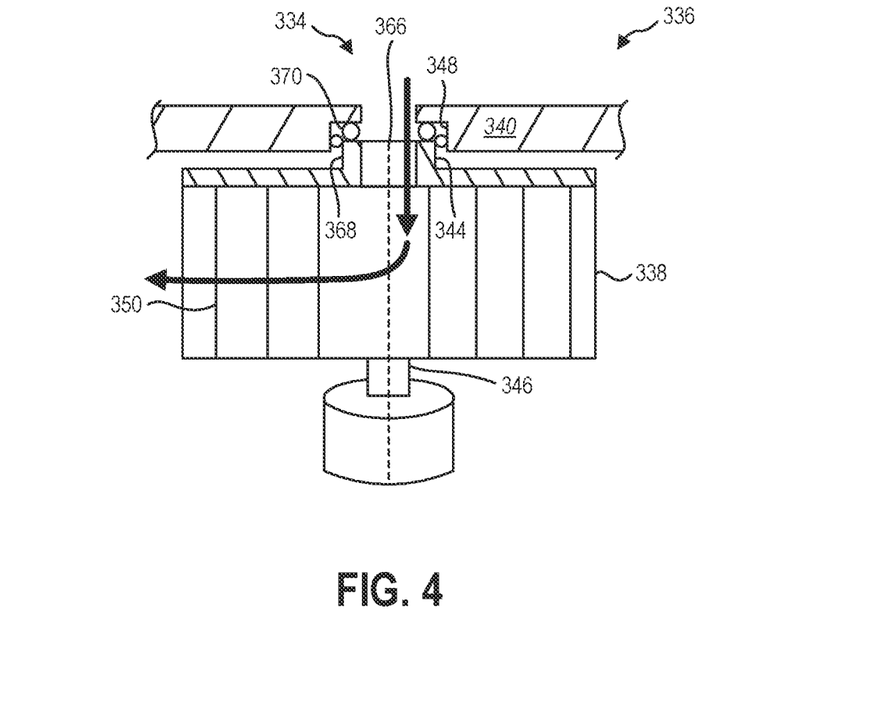
FIG. 4 is a side cross-sectional view of a blower fan with an EMI shielding device, according to at least one embodiment of the present disclosure.

While FIGS. 3-1 and 3-2 illustrate an embodiment of an EMI shielding device 236 for an axial fan, in other embodiments, an EMI shielding device according to the present disclosure provides an electrical bridge to attenuate or shield EMI across other types of rotor-stator pairs. FIG. 4 is a side cross-sectional view of an embodiment of a blower fan with an axial EMI shielding device 336 according to the present disclosure. In some embodiments, a blower has a rotor 338 with fan blades 350 that draws a fluid (such as air) in through an aperture 334 (or blows fluid out through the aperture 334), and the aperture 334 is a potential EMI leakage point of the housing. For example, a low-profile blower may be used in a laptop computing device, such as that described in relation to FIG. 1, and the positioning of the electronic components of the computing device may be close to the aperture 334.

In some embodiments, the proximate surface 344 of the rotor 338 (in this case, a blower fan rotor) is not the radially outermost edge of the rotor 338, but rather an axial surface 366 of the rotor 338 and/or a radially outward facing surface 368 of the rotor 338 that is not the radially outermost edge. The contact surface 348, similarly, may be an axial surface or a radial surface that is opposite the proximate surface 344 of the rotor 338.

In some embodiments, the EMI shielding device 336 includes an electrical bridge that includes bearings 370 that provide an electrically conductive contact between the rotor 338 and the stator 340. In some embodiments, the bearings 370 include race bearings, such as positioned between radial surfaces of the rotor 338 and stator 340. In some embodiments, the bearings 370 include thrust bearings, such as positioned between axial surfaces relative to the rotational axis 346 of the rotor 338.

The electrical bridge includes, in some embodiments, a lubricant. In at least one example, the lubricant is an electrically conductive lubricant, such as graphite. An electrically conductive lubricant may be used with any of the electrical bridges herein to limit and/or prevent wear on the portions of the electrical bridge that provide a physical contact for electrical conductivity, such as the conductive fibers 242 described in relation to FIG. 3-1 and FIG. 3-2. In other embodiments, the electrically conductive lubricant provides the electrical conductivity when other portions of the electrical bridge are electrically insulating. For example, a race bearing that includes ceramic bearings may include a graphite lubricant to provide electrical conductivity, despite the ceramic bearings being electrically non-conductive.

While FIG. 4 illustrates an embodiment of an EMI shielding device 336 including a blower fan rotor 338 with a proximate surface 344 that is radially inside a radially outermost edge of the rotor 338, in other embodiments, an electrical bridge including bearings may be positioned at the radially outermost edge of the rotor 338, such as the location of the conductive fibers 242 described in relation to FIG. 3-1 and FIG. 3-2.

Figure 5:
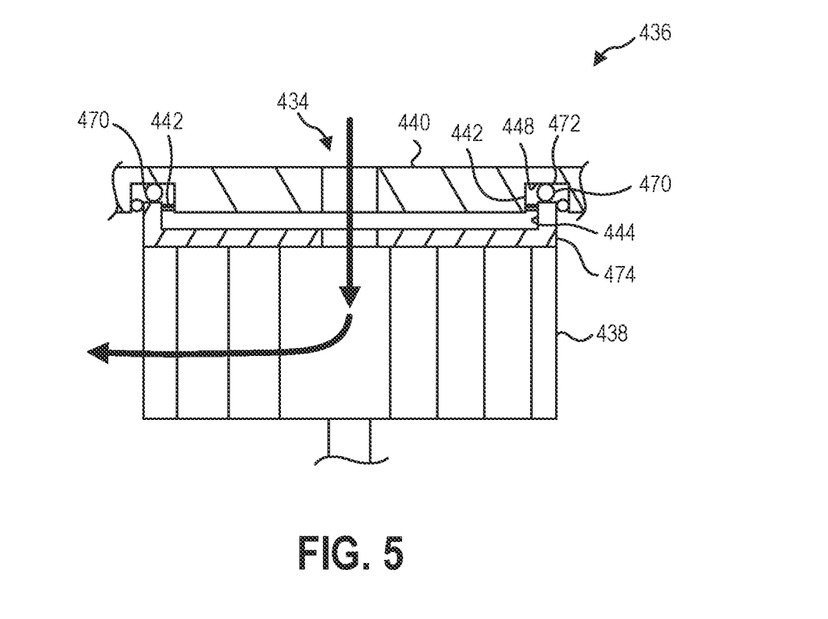
FIG. 5 is a side cross-sectional view of another blower fan with an EMI shielding device, according to at least one embodiment of the present disclosure.

Referring now to FIG. 5, a side cross-sectional view of an embodiment of an EMI shielding device 436 with a bearing 470 between a radially outermost edge of the rotor 438 and the stator 440 is shown. In some embodiments, at least a portion of the rotor 438 is received by a recess 472 or recesses of the housing stator 440. In some embodiments, the recess 472 receives a portion of the rotor 438. In some embodiments, the recess 472 receives a projection 474 projecting from the rotor 438. The gap between a proximate surface 444 of the projection 474 and the contact surface 448 of the recess 472 is bridged by an electrical bridge.

In some embodiments, the electrical bridge includes a bearing 470, such as a race bearing and/or thrust bearing. In some embodiments, the electrical bridge includes one or more conductive fibers 442. In some embodiments, the electrical bridge includes an electrically conductive lubricant.

Figure 6:
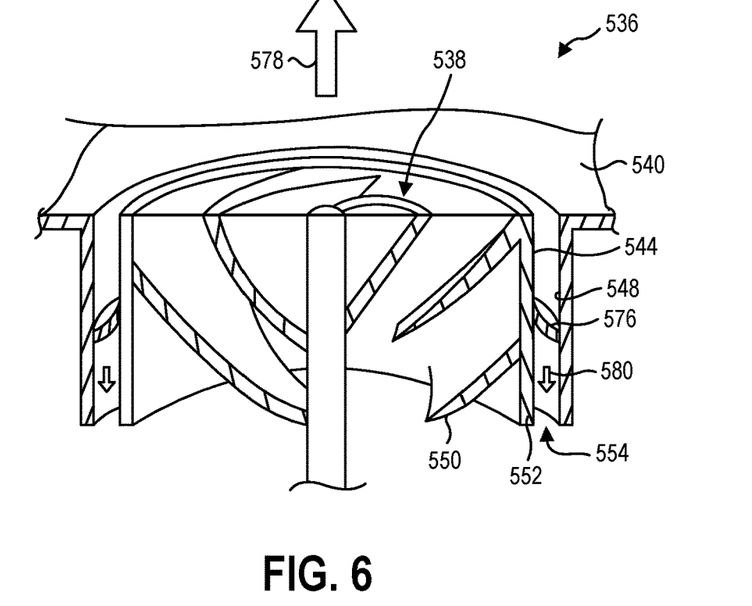
FIG. 6 is a perspective cross-sectional view of an axial fan with a flexible membrane EMI shielding device, according to at least one embodiment of the present disclosure.

FIG. 6 is a perspective cross-sectional view of an embodiment of an EMI shielding device 536 with a flexible membrane 576 in a gap 554 between the rotor 538 and the stator 540. In some embodiments, the flexible membrane 576 is electrically conductive, such as an electrically conductive metal membrane. The electrically conductive metal may be elastically deformed within the elastic deformation regime of the metal to apply a force between the proximate surface 544 of the rotor 538 and the contact surface 548 of the stator 540. In some embodiments, the flexible membrane is a non-metal membrane that is electrically conductive, such as an electrically conductive polymer. In some embodiments, the flexible membrane 576 has an electrically conductive lubricant applied thereto to reduce wear between the flexible membrane 576 and the proximate surface 544 of the rotor 538 and the contact surface 548 of the stator 540.

In some embodiments, the flexible membrane 576 is elastically biased to apply a contact force between the proximate surface 544 of the rotor 538 and the contact surface 548 of the stator 540. In at least one embodiment, the flexible membrane 576 is positioned and arranged to apply a contact force between the proximate surface 544 of the rotor 538 and the contact surface 548 of the stator 540 in response to a region of lower fluid pressure created by the rotation of the fan rotor 538. For example, rotation of the fan rotor 538 causes the fan blades 550 to rotate and urge airflow 578 through the rotor 538 and out of the housing stator 540. The resulting region of low fluid pressure 580 inside the housing stator 540 and/or on the opposite side of the rotor 538 urges the angled flexible membrane 576 to lever the flexible membrane 576 and increase and/or cause the contact force between the proximate surface 544 of the rotor 538 and the contact surface 548 of the stator 540.

For example, the flexible membrane 576 may be fixed to the contact surface 548 of the stator 540 and angled in the direction of airflow 578 of the fan rotor 538. The flexible membrane 576 is urged toward the proximate surface 544 of the rotor 538 by the pressure difference and provides the electrical conductivity between the stator 540 and the rotor 538. In at least one example, the pressure difference can assist in maintaining contact between the flexible membrane 576 and the proximate surface 544 as the flexible membrane 576 wears. For example, as the flexible membrane 576 wears due to friction with the proximate surface 544 (or with the contact surface 548 in embodiments with the flexible membrane 576 fixed to the rotor 538), the contact point between the flexible membrane 576 and the rotor 538 may change. In a particular example, the contact point may move longitudinally along the annular body 552 of the rotor 538 as the flexible membrane 576 shortens due to wear.

Figure 71:
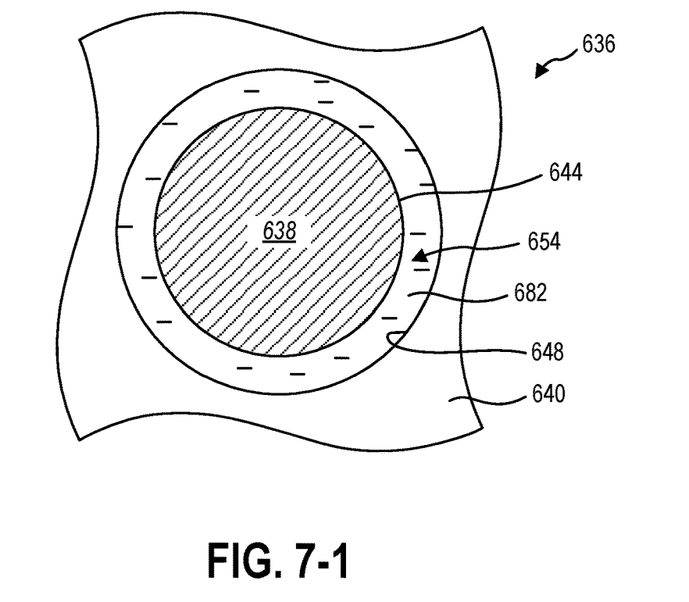

In other embodiments, the electrical bridge is not a solid member that contacts a surface or other solid member. FIG. 7-1 is a transverse cross-sectional view of an embodiment of an EMI shielding device 636 with a solid rotor 638. In some embodiments, the rotor 638 is a solid or tubular shaft for transferring torque relative to the stator 640. In some embodiments, the rotor 638 is a drive shaft for an electric motor. In some embodiments, the electrical bridge includes or is an electrically conductive fluid 682 positioned in a gap 654 between the proximate surface 644 of the rotor 638 and the contact surface 648 of the stator 640.

In some embodiments, the electrically conductive fluid 682 is a lubricant. In some embodiments, the electrically conductive fluid 682 is a liquid, such as metallic particle-bearing liquid. In some embodiments, the electrically conductive fluid 682 is a gas, such as a plasma. The electrically conductive fluid 682 contacts both the proximate surface 644 of the rotor 638 and the contact surface 648 of the stator 640 and provides an electrical path between the rotor 638 and stator 640 to attenuate and/or block EMI from passing through the gap 654. In some embodiments, the electrically conductive fluid 682 circumferentially surrounds a portion the rotor 638. In other embodiments, the electrically conductive fluid 682 is positioned around less than the full circumference of the rotor 638.

Figure 72:
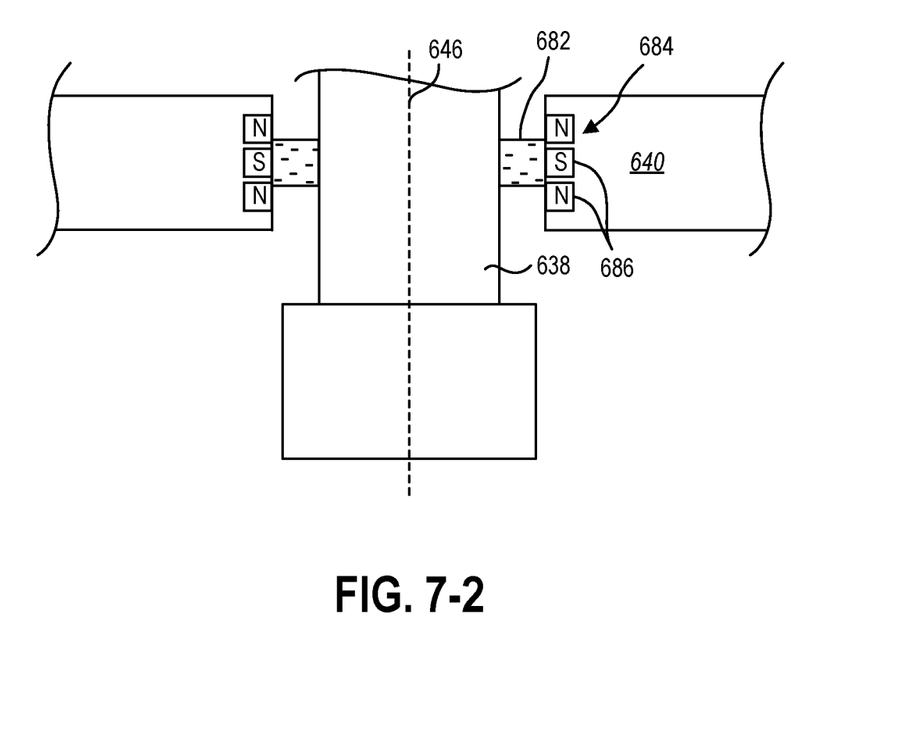

Referring now to FIG. 7-2, FIG. 7-2 is a longitudinal cross-sectional view of the EMI shielding device 636 of FIG. 7-1. The electrically conductive fluid 682 may be retained longitudinally relative to the shaft (in the longitudinal direction of the rotational axis 646) so as to hold the electrically conductive fluid 682 in contact with the proximate surface 644 and the contact surface 648.

In some embodiments, the electrically conductive fluid 682 is retained longitudinally with a magnetic trap 684 retaining the electrically conductive fluid 682 between the rotor 638 and the stator 640. For example, the electrically conductive fluid 682 may be a ferromagnetic fluid. In other examples, the electrically conductive fluid 682 may be a plasma. The magnetic trap 684 includes one or more magnets 686 that establish a magnetic field that holds the electrically conductive fluid 682 in place, longitudinally, relative to the rotor 638. In some embodiments, the magnets 686 are permanent magnets. In some embodiments, the magnets 686 are electromagnets.

In some embodiments, the electrically conductive fluid 682 is retained longitudinally with one or more gaskets, seals, O-rings, or other physical elements that retain the electrically conductive fluid 682 between the rotor 638 and the stator 640. For example, a magnetic trap 684 may be ineffective on an electrically conductive fluid 682 that is non-magnetic. The electrically conductive fluid 682 is an electrical bridge that provides electrical connection between the rotor 638 and the stator 640.

In at least one embodiment, an EMI shielding device with an electrical bridge according to the present disclosure attenuates or blocks EMI in rotational interfaces. In some embodiments, the EMI shielding device positions an electrical bridge between rotor and stator to substantially fill the gap therebetween and block EMI. In some embodiments, the electrical bridge divides the gap into channels allow airflow therethrough while attenuating the passage of EMI through the channels.

INDUSTRIAL APPLICABILITY

The present disclosure relates generally to systems and methods for electromagnetic interference (EMI) or radio frequency (RF) shielding. More particularly, the EMI shielding devices described herein are configured to provide EMI or RF shielding for a general-purpose computing device, a specialized video game console or other specialized computing device, and other electronic devices such as electric motors. In some embodiments, EMI shielding devices according to the present disclosure are configured to allow rotation of a rotor relative to and/or through an aperture in a device housing. The rotor may be a fan rotor, such as an axial fan or transverse blower in a personal computer or video game console, or a shaft rotor, such as a drive shaft of an electric motor that transfers torque through a housing or chassis. In some embodiments, EMI shielding devices according to the present disclosure allow rotation of the rotor relative to the stator while limiting and/or preventing transmission of EMI into or out of the aperture in the device housing.

In some embodiments, an EMI shielding device according to the present disclosure is positioned proximate a fan to receive heat from a computing component of the electronic device. In some examples, the computing component, such as a processor, system memory, hardware storage device, networking device, etc. may be susceptible to EMI that compromises the performance of the computing component. In other examples, the computing component may generate EMI that adversely affects the performance of other computing components of the electronic device.

In some embodiments, an EMI shielding device according to the present disclosure is part of a fan. The fan may move air over, through, or past a thermal management device (such as a fin pack), which receives heat from at least one heat source in the electronic device and transfers the heat to the air. In some embodiments, the heat source is a processor, such as a central processing unit (CPU), a graphical processing unit (GPU); a storage device, such as random-access memory (RAM), other volatile memory, non-volatile memory, or combinations thereof. In some embodiments, the heat source is coupled directly to the thermal management device. In some embodiments, the heat source is thermally connected to the thermal management device with at least one thermally conductive or convective element therebetween.

In some examples, the heat source is thermally connected to the thermal management device by a thermal interface material (TIM), such as a thermal paste, sandwiched between a surface of the heat source and a surface of the thermal management device. In some examples, the heat source is thermally connected to the thermal management device by a heat pipe, vapor chamber, heat spreader, or other thermally conductive or convective element that transports heat from a surface of the heat source to a surface of the thermal management device. The thermal management device is thermally connected to the heat source when at least element of the thermal management system is intended to physically connect the thermal management device to the heat source. In other words, a thermal management device that receives heat from the heat source only by ambient air flowing therebetween is not thermally connected, while a thermal management device connected to a heat source by a vapor chamber with a two-phase working fluid moving therein is thermally connected when a surface of the vapor chamber contacts a surface of the heat source and a surface of the thermal management device. In another example, a thermal management device is thermally connected to the heat source when the heat source is in contact with a first TIM, which contacts a surface of a heat pipe, which contacts a second TIM, which contacts a surface of the thermal management device.

In some embodiments, an EMI shielding device according to the present disclosure allows airflow through an aperture to reject excess heat to the ambient atmosphere while also limiting and/or preventing EMI from passing through the aperture in the housing proximate the fan. In some embodiments, the EMI shielding device includes a plurality of channels between the rotor and stator. In some embodiments, the channels have a maximum transverse dimension (e.g., width) that is less than a longitudinal dimension (e.g., length) to limit the passage of EMI through the channel.

In some examples, a computing device includes a first portion and a second portion movably connected to one another by a hinge. In some embodiments, the first portion of the computing device may include a display to present visual information to a user and the second portion of the computing device may include one or more input devices, such as a trackpad, a keyboard, etc., to allow a user to interact with the computing device. In embodiments in which the computing device is a hybrid computer, the first portion may include the display and at least a processor. The first portion may further include additional computer components, such as a storage device, system memory, a graphical processing unit, graphics memory, one or more communication devices (such as WIFI, BLUETOOTH, near-field communications), peripheral connection points, etc. In some embodiments, the first portion may be removable from the hinge and/or the second portion.

In some embodiments, the computing device is a specialized computing device, such as a video game console, or a general-purpose desktop tower computer that is connected to an external display and/or audio devices. In such embodiments, the computing device includes one or more of the computer components, such as a storage device, system memory, a graphical processing unit, graphics memory, one or more communication devices (such as WIFI, BLUETOOTH, near-field communications), peripheral connection points, etc. in a single housing of the computing device.

The computing device includes a variety of components that generate heat. The heat sources can be any component of the computing device that generates heat but, particularly, may include a processor (such as a central processing unit (CPU), a graphical processing unit (GPU), a physics processing unit, or other processors), system memory, video memory, storage devices, networking devices, display devices, input devices, optical drives, peripheral connection ports, or any other components of the computing device.

In some embodiments, the heat from the heat sources is distributed from a heat source across a surface by a heat spreader. In other embodiments, the heat is conducted from the heat sources toward a cooler region of the computing device and/or toward an exhaust by a heat transfer element. In yet other embodiments, the heat is conducted from a heat source through a cold-plate to a heat transfer element.

The heat transfer element may be a thermally conductive material, such as copper, silver, or aluminum that conducts heat from a region of higher thermal energy to a region of lower thermal energy. For example, the heat transfer element will conduct thermal energy from the first end of the heat transfer element adjacent the heat sources toward a cooler second end of the heat transfer element near a heat sink to lessen a temperature gradient along the heat transfer element. In other examples, the heat transfer element may be a heat pipe that may further aid in transferring thermal energy away from the heat sources.

At the higher temperature ("hot") interface of a heat pipe a liquid in contact with a thermally conductive solid surface turns into a vapor by absorbing heat from that surface. The vapor then travels along the heat pipe to a lower temperature ("cold") interface and condenses back into a liquid releasing the latent heat. The liquid then returns to the hot interface through, for example, capillary action, centrifugal force, or gravity, and the cycle repeats. Due to the high heat transfer coefficients for boiling and condensation, vapor cooling system heat pipes are effective thermal conductors. The effective thermal conductivity varies with heat pipe length and can approach 100 kW/(m·K) for long heat pipes, in comparison with approximately 400 W/(m·K) for copper.

In some embodiments, the second end of heat transfer element is in contact with, in proximity to, or attached to a heat sink, such as a fin pack. The fin pack includes or is made of a thermally conductive material to conduct thermal energy from the second end of the heat transfer element into the fin pack. The fin pack has a plurality of fins, channels, rails, or other structures that increase the surface area of the fin pack to dissipate the thermal energy.

In some embodiments, the thermally conductive material has a thermal conductivity in a range having an upper value, a lower value, or upper and lower values including any of 100 Watts per meter-Kelvin (W/m·K), 125 W/m·K, 150 W/m·K, 175 W/m·K, 200 W/m·K, 250 W/m·K, 300 W/m·K, 400 W/m·K, 450 W/m·K, or any values therebetween. For example, the thermal conductivity may be greater than 100 W/m·K. In other examples, the thermal conductivity may be less than 450 W/m·K. In yet other examples, the thermal conductivity may be between 100 W/m·K and 450 W/m·K. In further examples, the thermal conductivity may be greater than 150 W/m·K. In at least one example, the thermal conductivity may be greater than 250 W/m·K.

The cooling system dissipates the thermal energy through air flowed through or over the fin pack by a fan. The fan may move air flow through one or more channels of the fin pack such that air absorbs thermal energy from the surfaces of the fin pack. The dissipation of heat from the fin pack reduces the temperature of the fin pack to allow the heat transfer element to transfer more heat from the heat sources to the fin pack.

In a conventional computing device, a Faraday cage may be positioned around or over at least a portion of the electronic components. For example, the processor or other electronic components of the computing device generate EM radiation during operation. The EM radiation emitted by the processor or other electronic components can interfere with the operation of an external electronic component. In other examples, an external electronic component produces EMI that may adversely impact the electronic components inside the Faraday cage.

The Faraday cage defines an external side (external to the Faraday cage) and an internal side (internal to the Faraday cage). The Faraday cage may include a conductive material to suppress the EM radiation from the processor or other electronic components internally. The internal conduction of the EM radiation along the Faraday cage shields the EM radiation that may interfere with the operation of the external electronic component(s) and vice versa.

However, a conventional Faraday cage is inefficient at transferring energy through the Faraday cage and may cause the heat sources to increase in temperature by limiting ventilation through the Faraday cage. In some embodiments, an aperture is provided in the Faraday cage to allow air flow through the aperture to exhaust the thermal energy (via warm air) from the heat sources and the computing device. In some embodiments, the aperture has a shaft positioned therethrough to transfer torque, such as produced by an electric motor or received by a generator. In either instance, the aperture is a potential source of EMI leakage through the Faraday cage.

In some embodiments, an EMI shielding device according to the present disclosure limits and/or prevent EMI leakage through the aperture by electrically connecting the rotor of the fan or shaft in the aperture to the stator of the aperture and/or Faraday cage housing of the computing device.

In some embodiments, an EMI shielding device for a rotating interface includes a rotor that rotates relative to a stator. While the embodiment of a rotor described in the following examples is an axial fan, it should be understood that the rotor may be other devices or components, as will be described herein. The rotor is positioned in or proximate to an aperture in the stator, and the rotor rotates relative to the stator. In some embodiments, such as an axial fan and/or a blower, the aperture allows airflow through a portion of the fan rotor.

The EMI shielding device includes an electrical bridge between the rotor and the stator. In some embodiments, the electrical bridge includes conductive fibers that provide an electrically conductive path between the rotor and the stator while the rotor rotates relative to the stator. The conductive fibers may be a conductive metal fiber, such as copper, or an electrically conductive non-metal conductive fiber, such as graphite or an electrically conductive polymer.

In other embodiments, the conductive fibers of the electrical bridge are arranged substantially continuously around the proximate surface between the proximate surface and the contact surface such that there are no channels formed. For example, the conductive fibers may form a continuous ring around at least a portion of the longitudinal length of the rotor in the longitudinal direction of the rotational axis. The continuous ring of conductive fibers may substantially cover the space in the aperture between the proximate surface and the contact surface. In other examples, the conductive fibers may be staggered (such as the rows positioned at an angle to the rotational axis) or randomly, such that, in the longitudinal direction through the aperture (e.g., from a top perspective), the electrical bridge appears continuous.

The conductive fibers may be positioned on a proximate surface of the fan rotor proximate to a contact surface of the aperture in the housing stator. In some embodiments, the proximate surface is a radially outermost edge of the fan rotor relative to the rotational axis of the fan rotor. The fan rotor rotates around the rotational axis to rotate relative to the housing stator in which the aperture is located.

In some embodiments, the conductive fibers are fixed to the fan rotor. For example, the conductive fibers are fixed to the proximate surface (e.g., the radially outermost edge) of the fan rotor that is proximate the contact surface of the aperture. In other embodiments, the conductive fibers are fixed to the housing stator. For example, the conductive fibers may be fixed to the contact surface of the aperture that is opposite the proximate surface of the fan rotor. In yet other embodiments, the conductive fibers are fixed to the fan rotor and the housing stator. For example, a first plurality of conductive fibers are fixed to the proximate surface (e.g., the radially outermost edge) of the fan rotor that is proximate the contact surface of the aperture and a second plurality of conductive fibers are fixed to the to contact surface of the aperture, where the first plurality of conductive fibers are positioned to contact and provide an electrical connection with the second plurality of conductive fibers as the fan rotor rotates relative to the housing stator.

The electrical bridge has a conductivity sufficient to allow transmission of electrical current across the electrical bridge to maintain the Faraday-cage effect. In some embodiments, the electrical bridge has a resistivity less than 500 milliohm per linear centimeter around an arc segment of 1 centimeter of the electrical bridge to provide sufficient conductivity. For example, the electrical bridge may have a resistivity less than 400 milliohm per linear centimeter. In other examples, the electrical bridge has a resistivity less than 250 milliohm per linear centimeter around an arc segment of 1 centimeter of the electrical bridge to provide sufficient conductivity.

In some embodiments, the proximate surface of the fan rotor is continuous around the fan rotor in the rotational direction around the rotational axis. In some embodiments, the proximate surface is an outermost surface of an annular body around the fan rotor. For example, the annular body may be a continuous annulus around the fan blade(s) of fan rotor that provides a continuous and electrically conductive surface around the circumference of the fan rotor.

In some embodiments, at least a portion of the EMI leakage occurs in a gap between the proximate surface of the rotor and the contact surface of the stator. In some embodiments, the gap is an annular space between the radially outermost edge of the annular body and the edge of the aperture. An EMI shielding device according to the present disclosure bridges that gap with an electrical bridge to provide electrical conductivity between the rotor and stator, such as conductive fibers.

In some embodiments, electrical bridge (e.g., the conductive fibers) partitions the gap into channels. In some embodiments, the channels allow airflow therethrough while attenuating EMI that would otherwise interfere with electronic components.

The EMI shielding device includes a plurality of conductive fibers arranged in rows that define a plurality of channels when contacting and providing electrical conductivity between the proximate surface of the rotor and the contact surface of the stator. The channels may allow airflow and EMI therethrough. The channels have a maximum transverse dimension that is transverse to longitudinal direction of the channels. For example, in the illustrated embodiment, the rows and, therefore, the channel(s) are oriented axially (e.g., substantially parallel to the rotational axis). In other examples, the channel(s) may have a longitudinal direction that is oriented at an angle to the rotational axis of the rotor.

The maximum transverse dimension in the illustrated embodiment is in the rotational direction between the rows of conductive fibers. In other examples, the maximum transverse dimension may be a gap height between the proximate surface of the rotor and the contact surface of the stator.

The attenuation of EMI by the EMI shielding device is at least partially related to a ratio of the maximum transverse dimension to a longitudinal dimension of the channels. The longitudinal dimension of the channel and the maximum transverse dimension form a channel ratio. In some embodiments, the channel ratio is at least 2:1. For example, the longitudinal dimension is at least double the maximum transverse dimension. In some embodiments, the channel ratio is at least 2.5:1. For example, the longitudinal dimension is at least two and a half times the maximum transverse dimension. In some embodiments, the channel ratio is at least 3:1. For example, the longitudinal dimension is at least three times the maximum transverse dimension. In some embodiments, the channel ratio is at least 5:1. For example, the longitudinal dimension is at least five times the maximum transverse dimension. In a particular example, the longitudinal dimension is 10.0 mm and the maximum transverse dimension is no more than 2.0 mm.

As used herein, a channel is a substantially closed conduit that allows fluid flow in substantially one direction, such as a tube, pipe, or other structure with a transverse aspect ratio of less than 5:1. The transverse dimension is measured through the transverse area of the channel 256, and the aspect ratio is the ratio of the minimum value of the transverse dimension 260 to the maximum dimension. For example, a circular channel has a transverse aspect ratio of 1:1. In another example, a square channel has a transverse aspect ratio of 1.41:1. In another example, a rectangular channel that is 4 mm by 2 mm has a transverse aspect ratio of 1.73:1.

In some embodiments, depending on the shape of the conductive fibers or other electrical bridge and the positioning of the conductive fibers or other electrical bridge between the rotor and stator, a channel according to the present disclosure may have a transverse cross-section that is square, rectangular, triangular, other regular polygonal, non-regular polygonal, circular, elliptical, other regular curved shapes, irregular curved shapes, or combinations thereof. The maximum transverse dimension of the channel is the transverse dimension that is greatest, irrespective of orientation perpendicular to the longitudinal dimension.

For example, the EM shielding of a Faraday-cage style shield is based upon the wavelength and the required attenuation at that wavelength. For example, the higher the frequency, the shorter the wavelength of the EM radiation. The shorter the wavelength, the smaller the pores or channel openings need to be to attenuate the EM radiation.

A Faraday-style shield operates by balancing the electrical fields on either side of the shield. A substantially continuous Faraday shield allows the free conduction of electrical charge through the walls of the Faraday shield and becomes a hollow conductor. Introducing an aperture into the Faraday shield allows the leakage of EM radiation through the aperture. For the Faraday shield to function as such, the aperture size must be many times smaller than the wavelength of the interest. In some embodiments, by positioning the EMI shielding device in an aperture of an electronic device housing, the EMI shielding device divides the aperture into a collection of smaller openings based on the channel size. However, as the channels are elongated, the EMI shielding device offers additional attenuation for EM radiation wavelengths smaller than the channel size, as the EM radiation must pass through the length of the channels to leak from the EMI shielding device. For example, attenuation may be controlled by the grounding of the components of the EMI shielding device, the maximum transverse dimension and longitudinal dimension of the channels, quantity of the channels, frequency, other factors, or combinations thereof.

In some embodiments, an EMI shielding device according to the present disclosure attenuates EMI in a frequency range of 2.2 GHz to 2.6 GHz. In other embodiments, an EMI shielding device attenuates EMI in a frequency range of 800 MHz to 900 MHz. In further embodiments, an EMI shielding device attenuates EMI in a frequency range of 1.8 GHz to 2.0 GHz. In yet further embodiments, a thermal management device attenuates EMI in a frequency range of 5.0 GHz to 6.0 GHz.

In some embodiments, an EMI shielding device according to the present disclosure attenuates EMI in the frequency range by at least 20 dB throughout the frequency range. In other embodiments, an EMI shielding device attenuates EMI in the frequency range by at least 30 dB throughout the frequency range. In yet other embodiments, an EMI shielding device attenuates EMI in the frequency range by at least 40 dB throughout the frequency range.

In some embodiments, an EMI shielding device according to the present disclosure attenuates EMI in the frequency range by an average of at least 20 dB across the frequency range. In other embodiments, an EMI shielding device attenuates EMI in the frequency range by an average of at least 30 dB across the frequency range. In yet other embodiments, an EMI shielding device attenuates EMI in the frequency range by an average of at least 40 dB across the frequency range.

In some embodiments, the proximate surface, contact surface, and/or electrical bridge of the channels include an electrically conductive material. Examples of suitable materials include, but are not limited to copper, aluminum, iron, tin, magnesium, or alloys thereof; graphite; and electrically conductive polymers.

In some embodiments, a blower has a rotor with fan blades that draws a fluid (such as air) in through an aperture (or blows fluid out through the aperture, and the aperture is a potential EMI leakage point of the housing. For example, a low-profile blower may be used in a laptop computing device, such as that described herein, and the positioning of the electronic components of the computing device may be close to the aperture.

In some embodiments, the proximate surface of the rotor (in this case, a blower fan rotor) is not the radially outermost edge of the rotor, but rather an axial surface of the rotor and/or a radially outward facing surface of the rotor that is not the radially outermost edge. The contact surface, similarly, may be an axial surface or a radial surface that is opposite the proximate surface of the rotor.

In some embodiments, the EMI shielding device includes an electrical bridge that includes bearings that provide an electrically conductive contact between the rotor and the stator. In some embodiments, the bearings include race bearings, such as positioned between radial surfaces of the rotor and stator. In some embodiments, the bearings include thrust bearings, such as positioned between axial surfaces relative to the rotational axis of the rotor.

The electrical bridge includes, in some embodiments, a lubricant. In at least one example, the lubricant is an electrically conductive lubricant, such as graphite. An electrically conductive lubricant may be used with any of the electrical bridges herein to limit and/or prevent wear on the portions of the electrical bridge that provide a physical contact for electrical conductivity. In other embodiments, the electrically conductive lubricant provides the electrical conductivity when other portions of the electrical bridge are electrically insulating. For example, a race bearing that includes ceramic bearings may include a graphite lubricant to provide electrical conductivity, despite the ceramic bearings being electrically non-conductive.

While some embodiments of an EMI shielding device includes a blower fan rotor with a proximate surface that is radially inside a radially outermost edge of the rotor, in other embodiments, an electrical bridge including bearings may be positioned at the radially outermost edge of the rotor.

In some embodiments, at least a portion of the rotor is received by a recess or recesses of the housing stator. In some embodiments, the recess receives a portion of the rotor. In some embodiments, the recess receives a projection projecting from the rotor. The gap between a proximate surface of the projection and the contact surface of the recess is bridged by an electrical bridge.

In some embodiments, the electrical bridge includes a bearing, such as a race bearing and/or thrust bearing. In some embodiments, the electrical bridge includes one or more conductive fibers. In some embodiments, the electrical bridge includes an electrically conductive lubricant.

In some embodiments, the flexible membrane is electrically conductive, such as an electrically conductive metal membrane. The electrically conductive metal may be elastically deformed within the elastic deformation regime of the metal to apply a force between the proximate surface of the rotor and the contact surface of the stator. In some embodiments, the flexible membrane is a non-metal membrane that is electrically conductive, such as an electrically conductive polymer. In some embodiments, the flexible membrane has an electrically conductive lubricant applied thereto to reduce wear between the flexible membrane and the proximate surface of the rotor and the contact surface of the stator.

In some embodiments, the flexible membrane is elastically biased to apply a contact force between the proximate surface of the rotor and the contact surface of the stator. In at least one embodiment, the flexible membrane is positioned and arranged to apply a contact force between the proximate surface of the rotor and the contact surface of the stator in response to a region of lower fluid pressure created by the rotation of the fan rotor. For example, rotation of the fan rotor causes the fan blades to rotate and urge airflow through the rotor and out of the housing stator. The resulting region of low fluid pressure inside the housing stator and/or on the opposite side of the rotor urges the angled flexible membrane to lever the flexible membrane and increase and/or cause the contact force between the proximate surface of the rotor and the contact surface of the stator.

For example, the flexible membrane may be fixed to the contact surface of the stator and angled in the direction of airflow of the fan rotor. The flexible membrane is urged toward the proximate surface of the rotor by the pressure difference and provides the electrical conductivity between the stator and the rotor. In at least one example, the pressure difference can assist in maintaining contact between the flexible membrane and the proximate surface as the flexible membrane wears. For example, as the flexible membrane wears due to friction with the proximate surface (or with the contact surface in embodiments with the flexible membrane fixed to the rotor), the contact point between the flexible membrane and the rotor may change. In at particular example, the contact point may move longitudinally along the annular body of the rotor as the flexible membrane shortens due to wear.

In other embodiments, the electrical bridge is not a solid member that contacts a surface or other solid member. In some embodiments, the rotor is a solid or tubular shaft for transferring torque relative to the stator. In some embodiments, the rotor is a drive shaft for an electric motor. In some embodiments, the electrical bridge includes or is an electrically conductive fluid positioned in a gap between the proximate surface of the rotor and the contact surface of the stator.

In some embodiments, the electrically conductive fluid is a lubricant. In some embodiments, the electrically conductive fluid is a liquid, such as metallic particle-bearing liquid. In some embodiments, the electrically conductive fluid is a gas, such as a plasma. The electrically conductive fluid contacts both the proximate surface of the rotor and the contact surface of the stator and provides an electrical path between the rotor and stator to attenuate and/or block EMI from passing through the gap. In some embodiments, the electrically conductive fluid circumferentially surrounds a portion of the rotor. In other embodiments, the electrically conductive fluid is positioned around less than the full circumference of the rotor.

In some embodiments, the electrically conductive fluid may be retained longitudinally relative to the shaft (in the longitudinal direction of the rotational axis) so as to hold the electrically conductive fluid in contact with the proximate surface and the contact surface.

In some embodiments, the electrically conductive fluid is retained longitudinally with a magnetic trap retaining the electrically conductive fluid between the rotor and the stator. For example, the electrically conductive fluid may be a ferromagnetic fluid. In other examples, the electrically conductive fluid may be a plasma. The magnetic trap includes one or more magnets that establish a magnetic field that holds the electrically conductive fluid in place, longitudinally, relative to the rotor. In some embodiments, the magnets are permanent magnets. In some embodiments, the magnets are electromagnets.

In some embodiments, the electrically conductive fluid is retained longitudinally with one or more gaskets, seals, O-rings, or other physical elements that retain the electrically conductive fluid between the rotor and the stator. For example, a magnetic trap may be ineffective on an electrically conductive fluid that is non-magnetic. The electrically conductive fluid is an electrical bridge that provides electrical connection between the rotor and the stator.

In at least one embodiment, an EMI shielding device with an electrical bridge according to the present disclosure attenuates or blocks EMI in rotational interfaces. In some embodiments, the EMI shielding device positions an electrical bridge between rotor and stator to substantially fill the gap therebetween and block EMI. In some embodiments, the electrical bridge divides the gap into channels allow airflow therethrough while attenuating the passage of EMI through the channels.

The present disclosure relates to systems and methods for EMI or RF shielding according to at least the examples provided in the sections below:

[A1] In some embodiments, an EMI attenuation device includes a housing stator, a fan rotor, and an electrical bridge therebetween. The housing stator has an aperture therethrough, and at least a portion of the housing stator is electrically conductive. The fan rotor is adjacent to the aperture and has a rotational axis relative to the housing stator and a proximate surface proximate the housing stator. The fan rotor is electrically conductive, and the proximate surface is continuous around a rotational direction of the fan rotor. The electrical bridge is between the proximate surface of the fan rotor and a contact surface of the housing stator.

[A2] In some embodiments, the electrical bridge of [A1] includes a plurality of electrically conductive fibers fixed to the proximate surface of the fan rotor and contacting the contact surface of the housing stator.

[A3] In some embodiments, the electrical bridge of [A1] includes a plurality of electrically conductive fibers fixed to the contact surface of the housing stator and contacting the proximate surface of the fan rotor.

[A4] In some embodiments, the electrical bridge of [A1] includes a first plurality of electrically conductive fibers fixed to the contact surface of the housing stator and a second plurality of electrically conductive fibers fixed to the proximate surface of the fan rotor and contacting the first plurality of electrically conductive fibers.

[A5] In some embodiments, the electrical bridge of any of [A1] through [A4] includes a conductive lubricant between the proximate surface of the fan rotor and the contact surface of the housing stator.

[A6] In some embodiments, the electrical bridge of [A1] includes a flexible membrane of electrically conductive material.

[A7] In some embodiments, the flexible membrane of [A6] is fixed to the contact surface of the housing stator and contacting the proximate surface of the fan rotor.

[A8] In some embodiments, the flexible membrane of [A6] is angled relative to a direction of the rotational axis.

[A9] In some embodiments, the proximate surface of any of [A1] through [A8] is annular around the rotational axis.

[A10] In some embodiments, the electrical bridge of [A1] includes a bearing contacting the contact surface of the housing stator and contacting the proximate surface of the fan rotor.

[A11] In some embodiments, the electrical bridge, the contact surface of the housing stator, and the proximate surface of the fan rotor of any of [A1] through [A10] define a plurality of channels, and each channel of the plurality of channels has a maximum transverse dimension perpendicular to a longitudinal direction of the rotational axis of 2.0 millimeters (mm).

[A12] In some embodiments, the electrical bridge, the contact surface of the housing stator, and the proximate surface of the fan rotor of any of [A1] through [A10] define a plurality of channels, and each channel of the plurality of channels has maximum transverse dimension perpendicular to a longitudinal direction of the rotational axis and a longitudinal dimension parallel to the rotational axis, and each channel of the plurality of channels has a channel ratio (longitudinal dimension to maximum transverse dimension) of at least 2:1.

[A13] In some embodiments, the fan rotor of any of [A1] through [A12] is an axial fan.

[A14] In some embodiments, the electrical bridge of any of [A1] through [A13] includes an electrically conductive fluid contacting the contact surface of the housing stator and contacting the proximate surface of the fan rotor.

[A15] In some embodiments, the electrically conductive fluid of [A14] is magnetically retained between the contact surface of the housing stator and the proximate surface of the fan rotor.

[B1] In some embodiments, an EMI attenuation device includes a stator having an aperture therethrough, a shaft rotor in the aperture, and an electrical bridge between the shaft rotor and a surface of the aperture. At least a portion of the stator proximate the aperture is electrically conductive. The shaft rotor has a rotational axis relative to the stator and a circular OD surface. The OD surface of the shaft rotor is electrically conductive, and the circular OD surface is continuous around a circumference of the shaft rotor. The electrical bridge is located between the circular OD surface of the shaft rotor and an ID surface of the aperture.

[B2] In some embodiments, the shaft rotor is a drive shaft for transferring torque through the aperture, and the electrical bridge includes a race bearing.

[C1] In some embodiments, an electronic device includes a housing with an aperture therein, a heat source, a heat transfer element, and an EMI shielding device located proximate the aperture. The heat transfer element is thermally connected to the heat source to transfer heat from the heat source toward an aperture in the housing. The EMI shielding device includes a stator having the aperture therethrough, and at least a portion of the stator is electrically conductive. The EMI shielding device also includes a fan rotor that is adjacent to the aperture, has a rotational axis relative to the stator, and has a proximate surface proximate the stator. The fan rotor is electrically conductive, and the proximate surface is continuous around a rotational direction of the fan rotor. The fan rotor is configured to exhaust heat from the heat transfer element through aperture. The electrical bridge is between the proximate surface of the fan rotor and a contact surface of the housing stator.

[C2] In some embodiments, the heat transfer element of [C1] includes a fin pack adjacent to the fan rotor.

[C3] In some embodiments, the fan rotor of [C1] or [C2] is a blower fan rotor.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "substantially", "about", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An electromagnetic interference (EMI) attenuation device comprising:
   a housing stator having an aperture therethrough, wherein at least a portion of the housing stator is electrically conductive;
   a fan rotor adjacent to the aperture and having a rotational axis relative to the housing stator and a proximate surface proximate the housing stator, wherein the fan rotor is electrically conductive and the proximate surface is continuous around a rotational direction of the fan rotor and the fan rotor allows fluid flow through the fan rotor and aperture; and
   an electrical bridge between the proximate surface of the fan rotor and a contact surface of the housing stator.

2. The EMI attenuation device of claim 1, wherein the electrical bridge includes a plurality of electrically conductive fibers fixed to the proximate surface of the fan rotor and contacting the contact surface of the housing stator.

3. The EMI attenuation device of claim 1, wherein the electrical bridge includes a plurality of electrically conductive fibers fixed to the contact surface of the housing stator and contacting the proximate surface of the fan rotor.

4. The EMI attenuation device of claim 1, wherein the electrical bridge includes a first plurality of electrically conductive fibers fixed to the contact surface of the housing stator and a second plurality of electrically conductive fibers fixed to the proximate surface of the fan rotor and contacting the first plurality of electrically conductive fibers.

5. The EMI attenuation device of claim 1, wherein the electrical bridge includes a conductive lubricant between the proximate surface of the fan rotor and the contact surface of the housing stator.

6. The EMI attenuation device of claim 1, wherein the electrical bridge includes a flexible membrane of electrically conductive material.

7. The EMI attenuation device of claim 6, wherein the flexible membrane is fixed to the contact surface of the housing stator and contacting the proximate surface of the fan rotor.

8. The EMI attenuation device of claim 6, wherein the flexible membrane is angled relative to a direction of the rotational axis.

9. The EMI attenuation device of claim 1, wherein the proximate surface of the fan rotor is annular around the rotational axis.

10. The EMI attenuation device of claim 1, wherein the electrical bridge includes a bearing contacting the contact surface of the housing stator and contacting the proximate surface of the fan rotor.

11. The EMI attenuation device of claim 1, wherein the electrical bridge, the contact surface of the housing stator, and the proximate surface of the fan rotor define a plurality of channels, wherein each channel of the plurality of channels has a maximum transverse dimension perpendicular to a longitudinal direction of the rotational axis of 2.0 millimeters (mm).

12. The EMI attenuation device of claim 1, wherein the electrical bridge, the contact surface of the housing stator, and the proximate surface of the fan rotor define a plurality of channels, wherein each channel of the plurality of channels has maximum transverse dimension perpendicular to a longitudinal direction of the rotational axis and a longitudinal dimension parallel to the rotational axis, and each channel of the plurality of channels has a channel ratio (longitudinal dimension to maximum transverse dimension) of at least 2:1.

13. The EMI attenuation device of claim 1, wherein the fan rotor is an axial fan.

14. The EMI attenuation device of claim 1, wherein the electrical bridge includes an electrically conductive fluid contacting the contact surface of the housing stator and contacting the proximate surface of the fan rotor.

15. The EMI attenuation device of claim 14, wherein the electrically conductive fluid is magnetically retained between the contact surface of the housing stator and the proximate surface of the fan rotor.

16. An electronic device comprising:
    a housing;
    a heat source;
    a heat transfer element thermally connected to the heat source to transfer heat from the heat source toward an aperture in the housing; and
    an EMI shielding device located proximate the aperture, the EMI shielding device including:
       a stator having the aperture therethrough, wherein at least a portion of the stator is electrically conductive;
       a fan rotor adjacent to the aperture and having a rotational axis relative to the stator and a proximate surface proximate the stator, wherein the fan rotor is electrically conductive and the proximate surface is continuous around a rotational direction of the fan rotor, wherein the fan rotor is configured to exhaust heat from the heat transfer element through the aperture and the fan rotor allows fluid flow through the fan rotor and aperture; and
       an electrical bridge between the proximate surface of the fan rotor and a contact surface of the housing stator.

17. The electronic device of claim 16, wherein the heat transfer element includes a fin pack adjacent to the fan rotor.

18. The electronic device of claim 16, wherein the fan rotor is a blower fan rotor.

19. The electronic device of claim 16, wherein the fan rotor is an axial fan rotor.

20. The electronic device of claim 16, wherein the electrical bridge, the contact surface of the housing stator, and the proximate surface of the fan rotor define a plurality of channels that allow fluid flow therethrough.

* * * * *